(12) United States Patent
Lee et al.

(10) Patent No.: US 10,256,298 B2
(45) Date of Patent: Apr. 9, 2019

(54) SEMICONDUCTOR STRUCTURE AND METHOD FOR FORMING THE SAME

(71) Applicant: Vanguard International Semiconductor Corporation, Hsinchu (TW)

(72) Inventors: Tsung-Hsiung Lee, Taoyuan (TW); Chun-Ting Yang, New Taipei (TW); Ho-Chien Chen, Keelung (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 15/422,577

(22) Filed: Feb. 2, 2017

(65) Prior Publication Data
US 2018/0218975 A1    Aug. 2, 2018

(51) Int. Cl.
| | | |
|---|---|---|
| H01L 23/52 | (2006.01) | |
| H01L 23/48 | (2006.01) | |
| H01L 21/28 | (2006.01) | |
| H01L 23/34 | (2006.01) | |
| H01L 29/06 | (2006.01) | |
| H01L 23/528 | (2006.01) | |
| H01L 21/768 | (2006.01) | |

(Continued)

(52) U.S. Cl.
CPC ........ *H01L 29/0649* (2013.01); *H01L 21/743* (2013.01); *H01L 21/764* (2013.01); *H01L 21/76879* (2013.01); *H01L 21/76897* (2013.01); *H01L 23/528* (2013.01)

(58) Field of Classification Search
CPC . H01L 29/0649; H01L 21/743; H01L 21/764; H01L 21/76879; H01L 21/76897; H01L 23/528

USPC ............... 257/774, 621, 751, 773, 777, 786, 257/E23.141, E23.142, E23.161, E21.499, 257/E21.546, E21.581, E21.585, E25.013, 257/E25.018, E27.06, E29.02; 438/381, 438/424, 595, 667
See application file for complete search history.

(56) References Cited

U.S. PATENT DOCUMENTS

| | | | | |
|---|---|---|---|---|
| 8,710,650 B2* | 4/2014 | Bang | ................. | H01L 21/76898 257/717 |
| 8,962,474 B2* | 2/2015 | Yu | ...................... | H01L 21/76898 257/774 |
| 9,425,127 B2* | 8/2016 | Yu | ...................... | H01L 21/76898 |

(Continued)

FOREIGN PATENT DOCUMENTS

| | | |
|---|---|---|
| CN | 102651355 A | 8/2012 |
| CN | 103456768 A | 12/2013 |

(Continued)

*Primary Examiner* — Dao H Nguyen
(74) *Attorney, Agent, or Firm* — Birch, Stewart, Kolasch & Birch, LLP

(57) ABSTRACT

A semiconductor structure and a method for forming the same are provided. The semiconductor structure includes a substrate and a semiconductor layer formed on the substrate. The semiconductor structure includes an isolation structure through the semiconductor layer, and the isolation structure has an opening with a first width, and the isolation structure has a vacuum gap. The semiconductor structure also includes a contact plug structure through the semiconductor layer, and the contact plug structure has an opening with a second width, and the second width is greater than the first width.

19 Claims, 10 Drawing Sheets

(51) Int. Cl.
*H01L 21/74* (2006.01)
*H01L 21/764* (2006.01)

(56) References Cited

U.S. PATENT DOCUMENTS

| | | | |
|---|---|---|---|
| 9,786,760 B1* | 10/2017 | Bonilla | H01L 29/4991 |
| 2012/0013022 A1* | 1/2012 | Sabuncuoglu Tezcan | H01L 21/7682 |
| | | | 257/774 |
| 2012/0104608 A1* | 5/2012 | Chung | H01L 21/76898 |
| | | | 257/738 |
| 2012/0292746 A1* | 11/2012 | Lee | H01L 21/76898 |
| | | | 257/621 |
| 2013/0127019 A1* | 5/2013 | Lee | H01L 25/0657 |
| | | | 257/621 |
| 2013/0320459 A1* | 12/2013 | Shue | H01L 21/76283 |
| | | | 257/392 |
| 2014/0374916 A1* | 12/2014 | Bu | H01L 21/76877 |
| | | | 257/774 |

FOREIGN PATENT DOCUMENTS

| TW | 200903806 A | 1/2009 |
|---|---|---|
| TW | 201118944 A1 | 6/2011 |

* cited by examiner

SEMICONDUCTOR STRUCTURE AND METHOD FOR FORMING THE SAME

BACKGROUND

Field of the Disclosure

The present disclosure relates to a semiconductor structure, and in particular it relates to a semiconductor structure with a contact plug structure.

Description of the Related Art

Semiconductor devices are used in a variety of electronic applications, such as personal computers, cell phones, digital cameras, and other electronic devices. These semiconductor devices are typically fabricated by depositing an insulating layer or dielectric layer, a conductive layer material, and a semiconductor layer material on the semiconductor substrate in sequence, followed by patterning the various material layers by using a photolithography process. Therefore, the circuit devices and components are formed on the semiconductor substrate.

In a semiconductor device, a top side contact structure is formed by using a deep trench isolation structure through the SOI substrate and applying an electrical voltage to the substrate.

Although existing semiconductor structures and their manufacturing methods have been generally sufficient to achieve the desired goals, they do not fully meet all of the requirements.

BRIEF SUMMARY

The disclosure provides a semiconductor structure. The semiconductor structure includes a substrate and a semiconductor layer formed on the substrate. The semiconductor structure includes an isolation structure through the semiconductor layer, and the isolation structure has an opening with a first width, and the isolation structure has a vacuum gap. The semiconductor structure also includes a contact plug structure through the semiconductor layer, and the contact plug structure has an opening with a second width, and the second width is greater than the first width.

The disclosure also provides a method for forming a semiconductor structure. The method includes providing a substrate and forming an oxide layer on the substrate. The method includes forming a semiconductor layer on the oxide layer and forming a first trench and a second trench in the semiconductor layer. An opening of the first trench has a first width, an opening of the second trench has a second width, and the second width is greater than the first width. The method further includes forming a first dielectric layer on sidewalk of the first trench and the second trench and on the first trench and the second trench. The opening of the first trench is enclosed by the first dielectric layer, but the second trench is not enclosed by the first dielectric layer. The method also includes removing a portion of the first dielectric layer and a portion of the oxide layer, such that the second trench passes through the oxide layer to expose the substrate.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

It should be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1A:
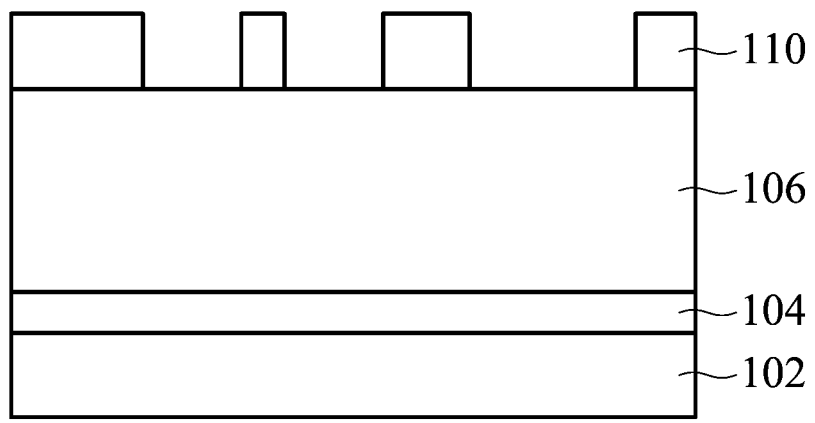
FIGS. 1A-1H show cross-sectional views of various stages of forming a semiconductor structure, in accordance with some embodiments.

The disclosure provides various embodiments of the semiconductor structure and method for forming the same. FIGS. 1A-1H show cross-sectional views of various stages of forming a semiconductor structure 100, in accordance with some embodiments. FIG. 2 shows a top view of a semiconductor structure 100 in accordance with some embodiments. FIG. 1A show cross-sectional views along AA' of FIG. 2.

Referring to FIG. 1A and 2 a substrate 102 is provided. The substrate 102 includes a central region 10 and a peripheral region 20. FIGS. 1A-1H show cross-sectional views of the peripheral region 20.

The substrate 102 may be made of silicon or other semiconductor materials. Alternatively or additionally, the substrate 102 may include other elementary semiconductor materials such as germanium (Ge). In some embodiments, the substrate 102 is made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium (SiGe), silicon germanium carbide (SiGeC), gallium arsenic phosphide (GaAsP), or gallium indium phosphide (GaInP). In some embodiments, the substrate 102 includes an epitaxial layer. For example, the substrate 102 has an epitaxial layer overlying a bulk semiconductor.

Afterwards, the oxide layer 104 is formed on the substrate 102. In some embodiments, the oxide layer 104 includes silicon oxide. Afterwards, a semiconductor layer 106, such as silicon (Si) layer, is formed on the oxide layer 104. Therefore, the semiconductor layer 106 and the oxide layer 104 are so-called silicon on insulators (SOI).

Afterwards, some transistors (not shown in Figure) are formed in the central region 10 of the substrate 102, for example, in the semiconductor layer 106. The transistors include metal oxide semiconductor field effect transistors (MOSFET), complementary metal-oxide semiconductor (CMOS), bipolar junction transistors (BJT), high-voltage transistors, high frequency transistors, p-channel or n-channel field effect transistors (PFETs or NFETs), diodes and/or other devices. Various processes are performed to form the transistors, such as deposition, etching, implanting, photolithography processes, annealing processes and/or other applicable processes.

A hard mask layer 110 is formed on the semiconductor layer 106. In some embodiments, the hard mask layer 110 is made of silicon nitride. The hard mask layer 110 may be formed by a low-pressure chemical vapor deposition (LP-CVD) process or a plasma-enhanced chemical vapor deposition (PECVD) process, or another process may be used in some other embodiments.

After the hard mask layer 110 is formed, a patterning process is performed on the hard mask layer 110 to form a patterned hard mask layer 110. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1B:
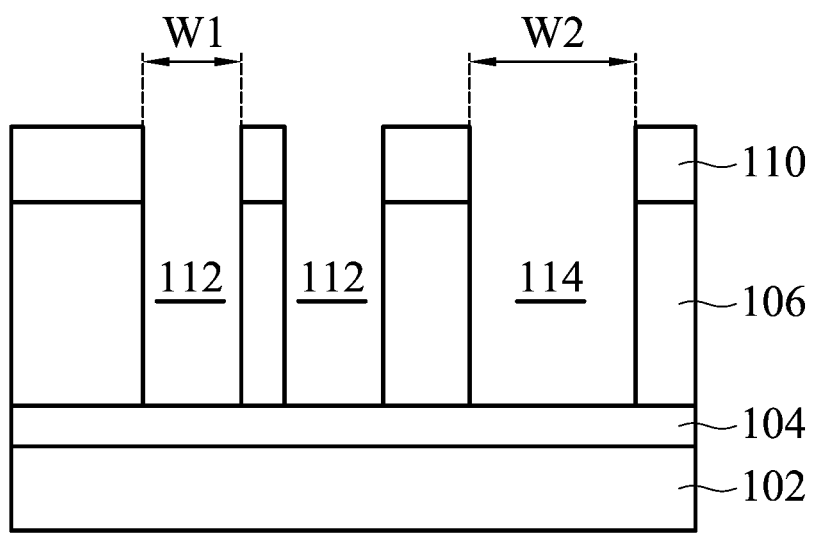
Figure 2:
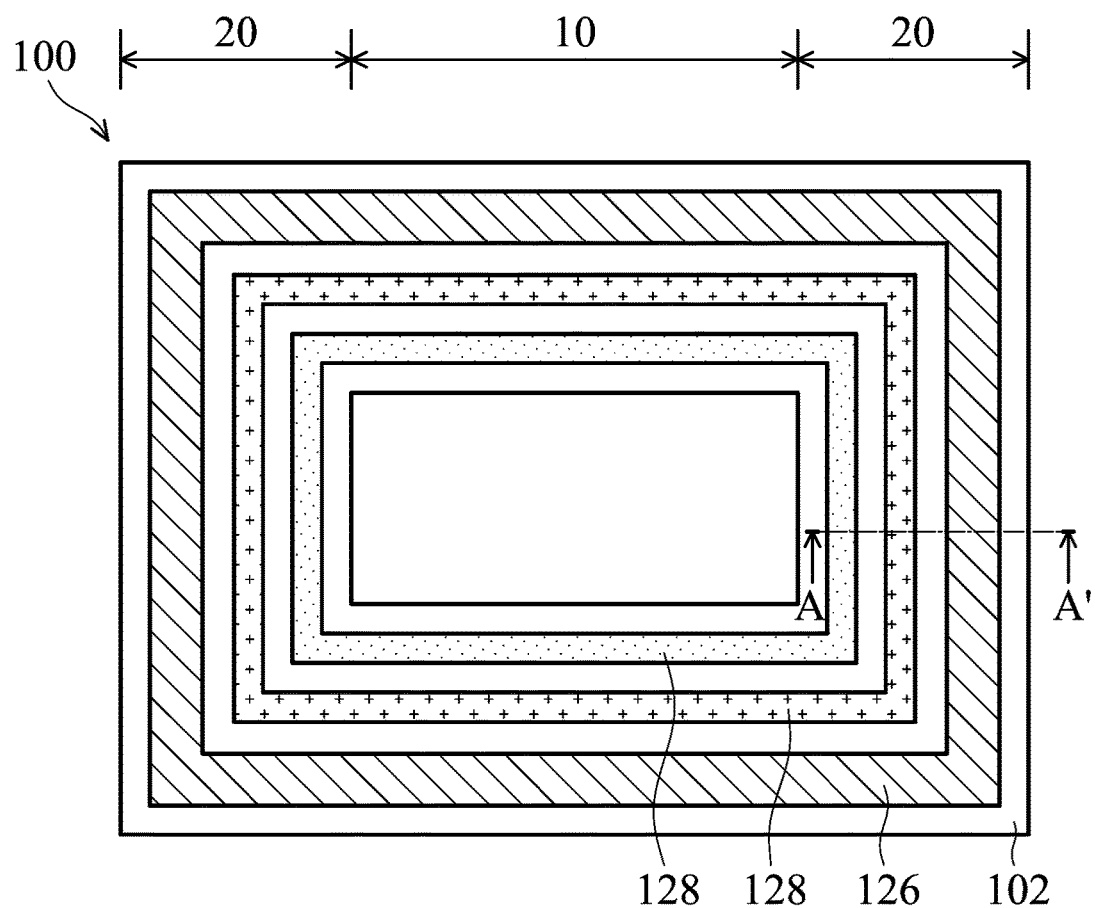
FIG. 2 shows a top view of a semiconductor structure, in accordance with some embodiments.

Next, as shown in FIG. 1B, a portion of the semiconductor layer 106 is removed to form a first trench 112 and a second trench 114 in the semiconductor layer 106 by using the patterned hard mask layer 110 as a mask, in accordance with some embodiments. The portion of the semiconductor layer 106 is removed by a method that includes an etching process, such as a dry etching process or a wet etching process.

A first trench 112 has an opening with a first width $W_1$, the second trench 114 has an opening with a second width $W_2$, and the second width $W_2$ is greater than the first width $W_1$. In some embodiments, the ratio of the first width $W_1$ to the second width $W_2$ is in a range from 1/1.2 to 1/3. In some embodiments, the first trench 112 has a depth in a range from about 2 µm to about 20 µm.

Figure 1C:
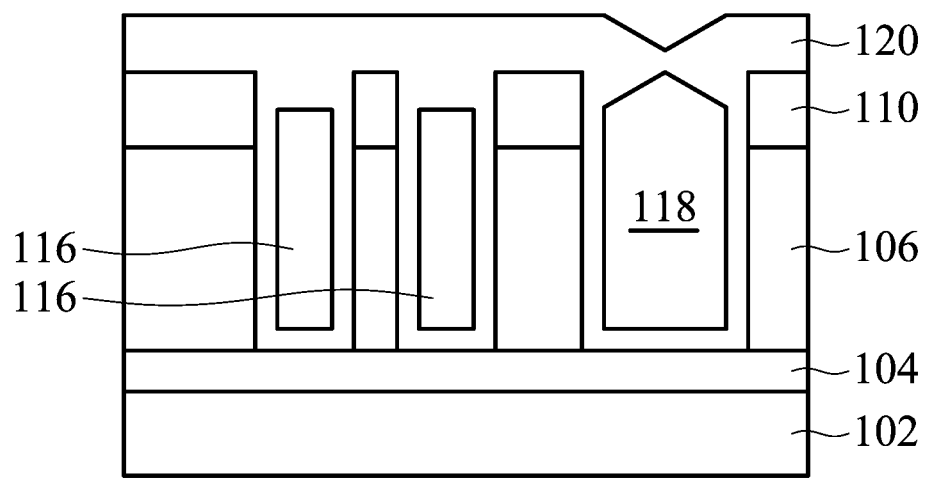

Next, as shown in FIG. 1C, a first dielectric layer 120 is formed on sidewalls and on the bottom surface of the first trench 112, on the top opening of the first trench 112, and on sidewalls of the second trench 114, in accordance with some embodiments.

The top opening of the second trench 114 is enclosed by the first dielectric layer 120, but the second trench 114 is not completely filled with the first dielectric layer 120. In some embodiments, the material of the first dielectric layer 120 includes oxide, nitride, carbide, other similar materials, or a combination thereof. In some embodiments, the material of the first dielectric layer 120 includes a silane-based oxide, tetraethyl orthosilicate, TEOS-based oxide, or a combination thereof.

A dielectric material is deposited in the sidewalls of the first trench 112 and the second trench 114 by a deposition process. During the deposition process, the deposition rate near the top opening is higher than the deposition rate away from the top opening (such as at the bottom of the first trench 112 or the bottom of the second trench 114), and therefore the top opening of the first trench 112 and the second trench 114 can be filled with the dielectric layer quickly, but the inside of the first trench 112 and the inside of the second trench 114 are not completely filled with the dielectric layer.

In some embodiments, the deposition process may be a chemical vapor deposition process (CVD), a physical vapor deposition process (PVD), another applicable process, or a combination thereof.

In some embodiments, the deposition process is the plasma enhanced chemical vapor deposition (PECVD) process for forming the first dielectric layer 120. When the PECVD process is used, the dielectric layer formed on top openings of the first trench 112 and the second trench 114 may be re-deposited by the plasma bombardment to form overhangs on the top openings. The first trench 112 cannot be conformally filled with dielectric layer due to the overhangs. As more dielectric layer is re-deposited by the plasma bombardment, the deposition rate of the overhangs at the top opening is increased. As a result, the top openings will narrow drastically until the top openings are completely enclosed by the overhangs. Therefore, a first vacuum gap 116 and a second vacuum gap 118 are formed in the first trench 112 and the second trench 114, respectively.

Figure 1D:
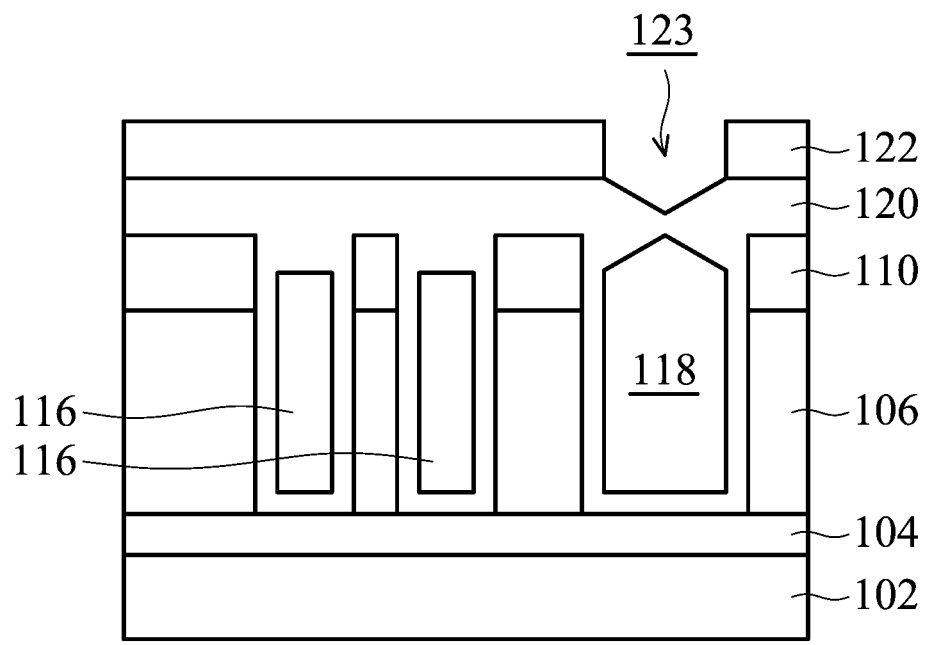

Next, as shown in FIG. 1D, a photoresist layer 122 is formed on the dielectric layer 120, in accordance with some embodiments. Afterwards, the photoresist layer 122 is patterned to form an opening 123 in the photoresist layer 122. The second vacuum gap 118 or the first dielectric layer 120 on the second trench 114 is exposed by the opening 123.

In the prior art, the opening of the trench is not enclosed, and the photoresist material will flow into the trench. The photoresist material inside of the trench is not easily removed by a development step in the subsequent process. As a result, the photoresist material is remaining. The remaining photoresist material blocks the implementation of the subsequent processes, and such problems may become serious in a deep trench. In order to resolve the problems of the remaining photoresist layer, a first dielectric layer 120 of the invention is formed before the formation of the photoresist layer 122. The dielectric layer 120 can enclose the opening of the second trench 114. Therefore, the photoresist layer 122 is blocked by the dielectric layer 120 in the subsequent process and cannot flow into the second trench 114 and no photoresist layer remains in the second trench 114.

Figure 1E:
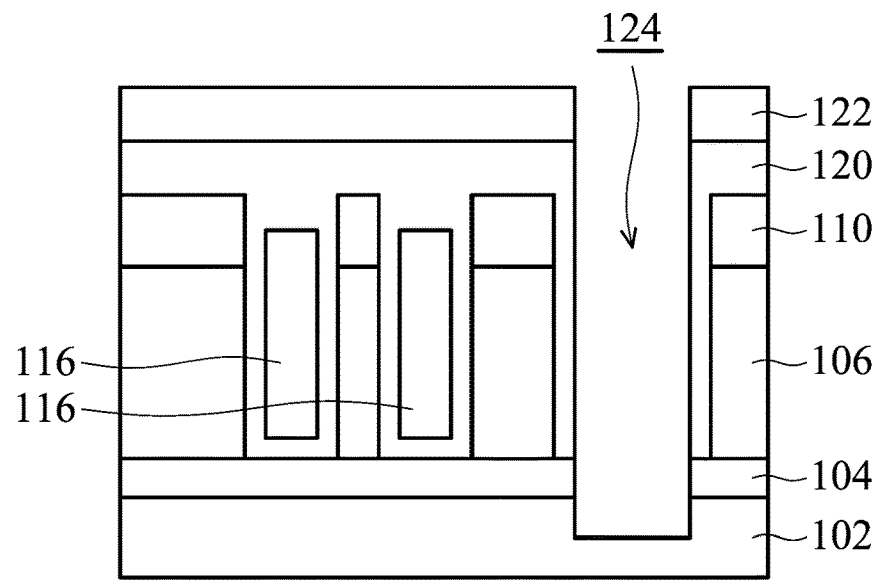

Afterwards, as shown in FIG. 1E, a portion of the first dielectric layer 120 and a portion of the oxide layer 104 are removed by using the photoresist layer 122 as a mask to form a contact opening 124, in accordance with some embodiments. The contact opening 124 passes through the oxide layer 104 and extends into the substrate 102. In some other embodiments, the bottom surface of the contact opening 124 is coplanar with the top surface of the substrate 102.

In some embodiments, a portion of the first dielectric layer 120 and a portion of the oxide layer 104 are removed by an etching process, but still a portion of the first dielectric layer 120 remains on a sidewall of the contact opening 124. In some other embodiments, no first dielectric layer 120 remains on the sidewall of the contact opening 124.

Figure 1F:
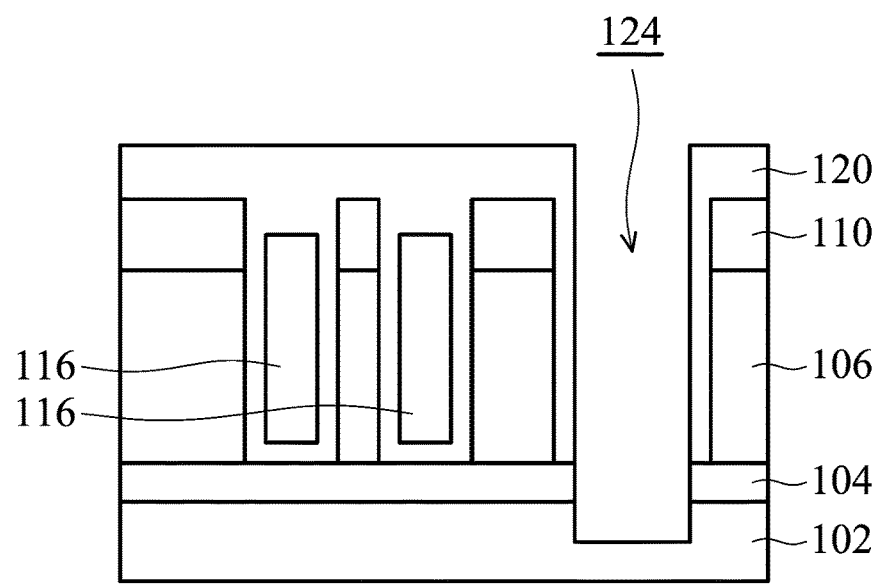

Next, as shown in FIG. 1F, the photoresist layer 122 is removed in accordance with some embodiments. The photoresist layer 122 is removed by an etching process, such as a dry etching process or a wet etching process.

Figure 1G:
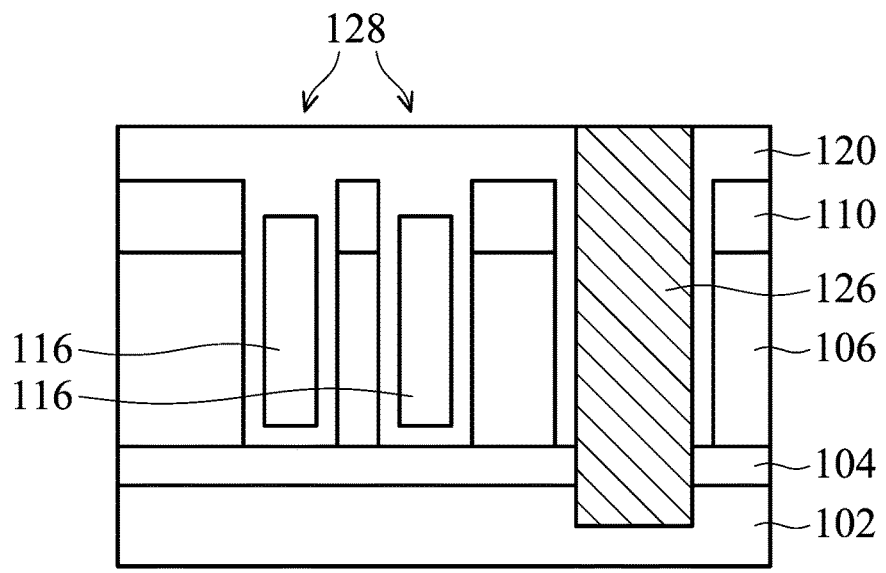

Next, as shown in FIG. 1G, the conductive material is filled into the contact opening 124, in accordance with some embodiments. Then, a polishing process is performed, such as chemical mechanical polishing (CMP) process, to remove extra conductive materials and to form a contact plug structure 126 through the semiconductor layer 106 and the oxide layer 104. Since the contact plug structure 126 is in direct contact with the substrate 102, the voltage of the substrate 102 may be controlled by the contact plug structure 126 when an electrical voltage is applied to the substrate 102.

In addition, an isolation structure 128 is formed in the position of the first trench 114. The isolation structure 128 is constructed by the first dielectric layer 120 and the first vacuum gap 116. The first vacuum gap 116 has a good isolation ability, and thus the isolation structure 128 has a better isolation effect compared with an isolation structure filled with dielectric materials.

Figure 1H:
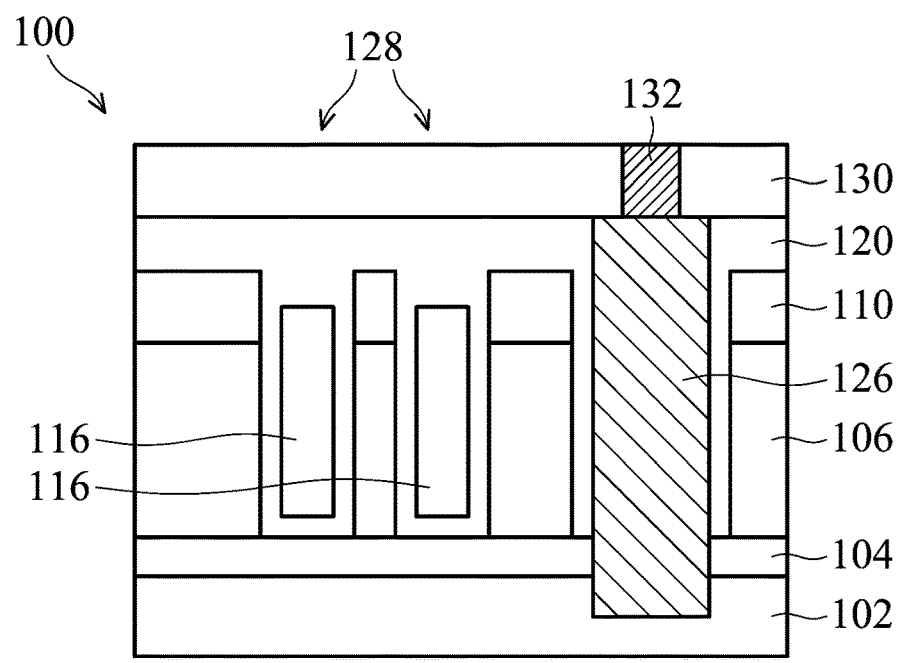

Next, as shown in FIG. 1H, an inter-layer dielectric (ILD) layer 130 is formed on the contact plug structure 126 and the second dielectric layer 120, in accordance with some embodiments. Therefore, a conductive structure 132 is formed in the ILD layer 130, and the conductive structure 132 is electrically connected to the contact plug structure 126. In other words, the contact plug structure 126 is in direct contact with the substrate 102, and the conductive structure 132 is electrically connected to substrate 102 by the contact plug structure 126.

It should be noted that, in the embodiment, in the step of FIG. 1C, the opening of the second trench 114 is enclosed by the first dielectric layer 120 when the first dielectric layer 120 is deposited. Therefore, no photoresist material remains on the bottom of the second trench 114, and there are no problems resulting from unwanted remaining photoresist material.

FIG. 2 shows a top-view of the semiconductor structure 100, in accordance with some embodiments. The contact plug structure 126 has a ring structure which surrounds or encloses the isolation structure 128 and also surrounds or encloses the devices in the central region 10. The ring structure can prevent the contact plug structure 126 from being interfered with by other devices. In some embodiments, the ring structure may have other top-view shapes, such as a circular shape, an elliptical shape, or other shapes. Alternatively, the isolation structure 128 may have a ring structure to surround the devices in the central region 10 and to prevent the devices from being interfered with by external signals.

FIGS. 3A-3I show cross-sectional views of various stages of forming a semiconductor structure 200, in accordance with some embodiments.

Figure 3A:
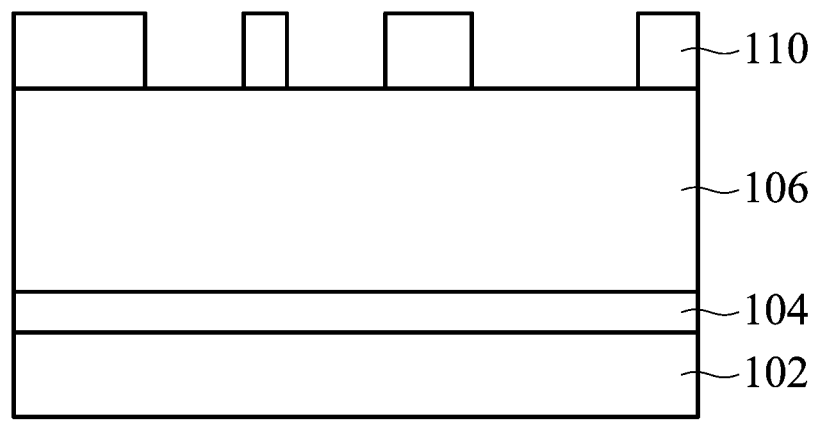
FIGS. 3A-3I show cross-sectional views of various stages of forming a semiconductor structure, in accordance with some embodiments.
Figure 3B:
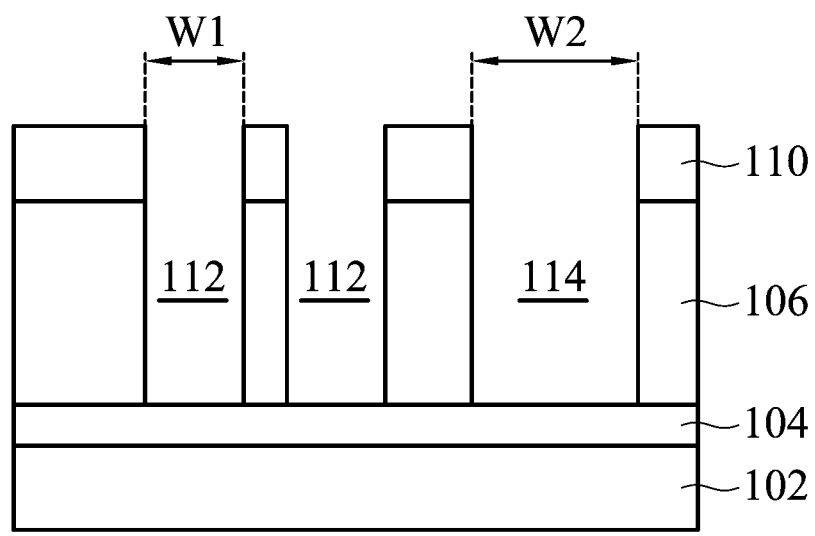

FIGS. 3A-3B are similar to FIGS. 1A-1B, and therefore the descriptions are omitted for brevity. It should be noted that the opening of the first trench 112 has a first width $W_1$, and the opening of the second trench 114 has a second width $W_2$, and the second width $W_2$ is greater than the first width $W_1$.

Figure 3C:
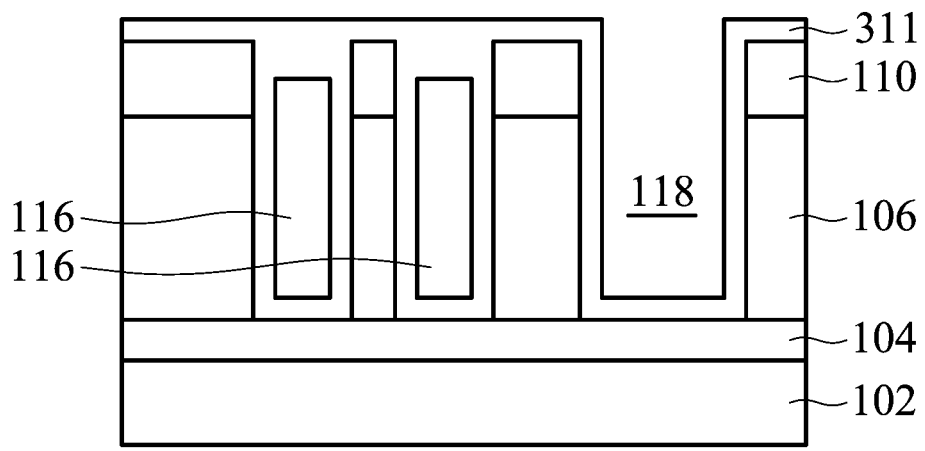

Referring to FIG. 3C, a first dielectric layer 311 is conformally formed in the first trench 112 and the second trench 114, in accordance with some embodiments. More specifically, the first dielectric layer 311 is conformally formed on sidewalls of the first trench 112 and the sidewalls of the second trench 114. The material of the first dielectric layer 311 includes oxide, nitride, carbide, other similar materials, or a combination thereof.

It should be noted that the first width $W_1$ of the first trench 112 is smaller than the second width $W_2$ of the second trench 114. Therefore, when the opening of the first trench 112 is enclosed by the first dielectric layer 311 during the deposition process, the opening of the second trench 114 is not enclosed by the first dielectric layer 311. The first dielectric layer 311 is only formed on bottom and sidewalls of the second trench 114, but does not completely fill the opening of the second trench 114. Furthermore, the first trench 112 may or may not be completely filled with the first dielectric layer 311 depending on the size of the first width $W_1$ of the first trench 112. In some embodiments, the first dielectric layer 311 is formed by a low-pressure chemical vapor deposition (LPCVD) process.

Figure 3D:
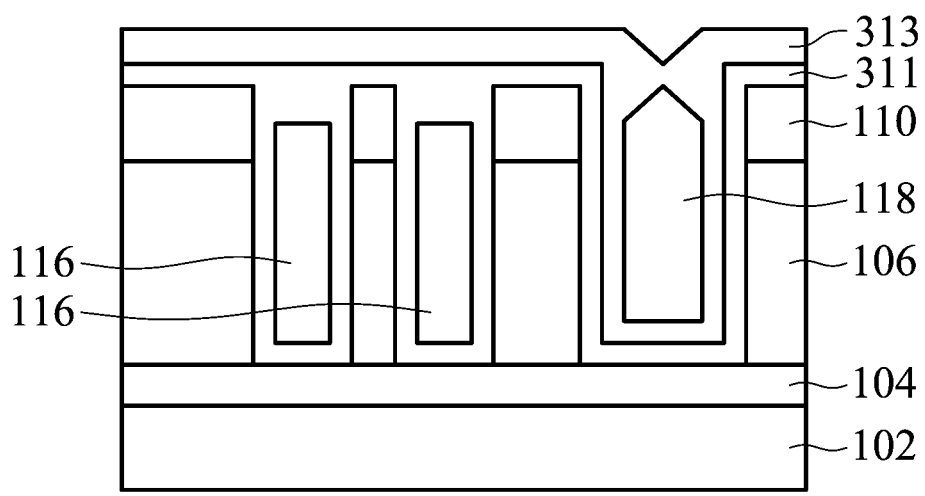

Afterwards, as shown in FIG. 3D, a second dielectric layer 313 is formed on the first dielectric layer 311, in accordance with some embodiments. The fabrication method of the second dielectric layer 313 is the same as, or similar to the fabrication method of the first dielectric layer 120 shown in FIG. 1C.

In some embodiments, the material of the second dielectric layer 313 is the same as the material of the first dielectric layer 311. The difference between the second dielectric layer 313 and the first dielectric layer 311 is that the first dielectric layer 311 is deposited by a low-pressure chemical vapor deposition (LPCVD) process, and then the second dielectric layer 313 is formed by a plasma-enhanced chemical vapor deposition (PECVD) process. Therefore, the second dielectric layer 313 can enclose the opening of the second trench 114, but cannot completely fill the second trench 114.

In some other embodiments, the material of the second dielectric layer 313 is different from the material of the first dielectric layer 311. The properties of the material of the first dielectric layer 311 are such that the first dielectric layer 311 is easily conformally formed along the shape of the trench, but the properties of the material of the second dielectric layer 313 are such that the second dielectric layer 313 encloses the opening of the trench easily.

Figure 3E:
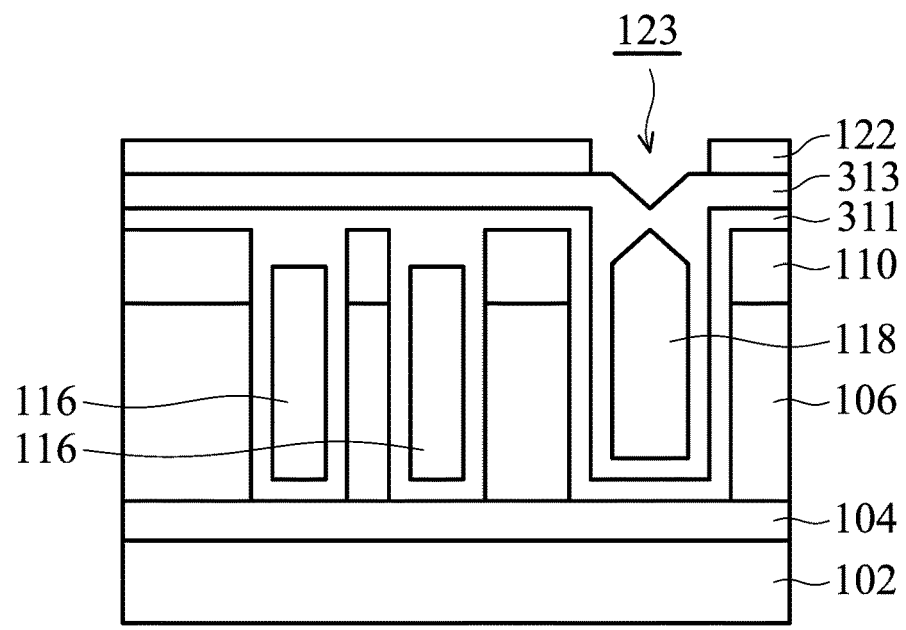

Next, as shown in FIG. 3E, the photoresist layer 122 is formed on the second dielectric layer 313, in accordance with some embodiments. Afterwards, the photoresist layer 122 is patterned to form an opening 123 in the photoresist layer 122. The second vacuum gap 118 or the first dielectric layer 120 on the second trench 114 is exposed by the opening 123.

Figure 3F:
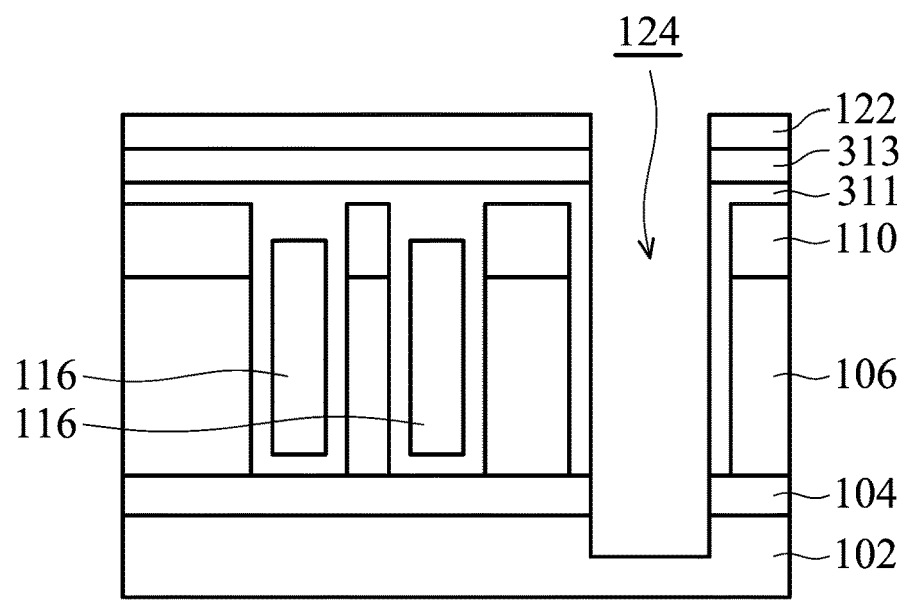

Afterwards, as shown in FIG. 3F, a portion of the first dielectric layer 120 and a portion of the oxide layer 104 are removed by using the photoresist layer 122 as a mask to form a contact opening 124, in accordance with some embodiments.

Figure 3G:
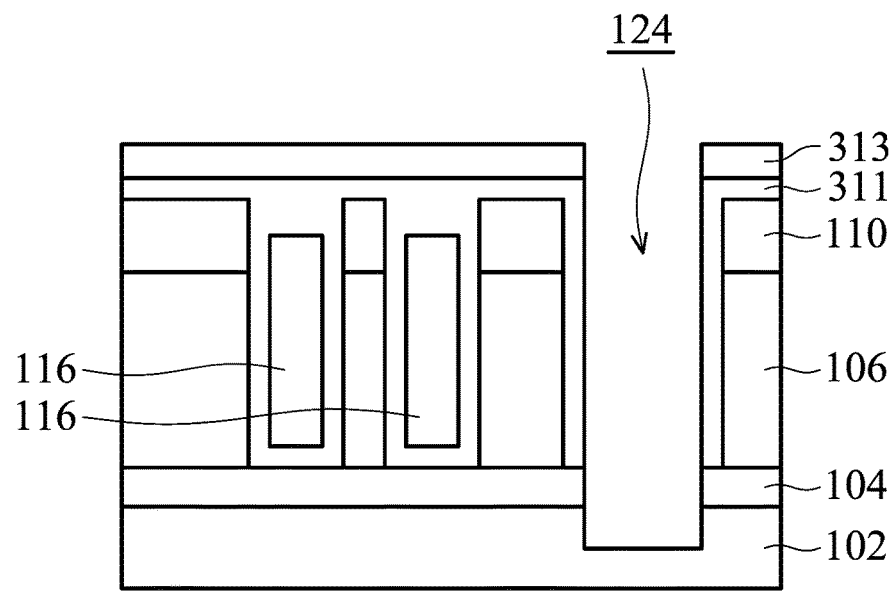

Afterwards, as shown in FIG. 3G, the photoresist layer 122 is removed in accordance with some embodiments. The photoresist layer 122 is removed by an etching process, such as a dry etching process or a wet etching process.

Figure 3H:
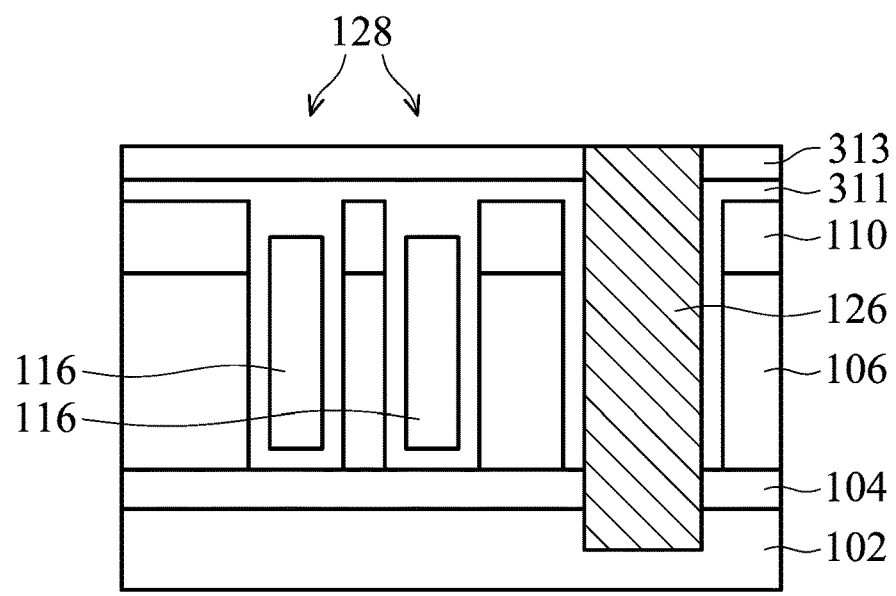

Next, as shown in FIG. 3H, the conductive material is filled into the contact opening 124, in accordance with some embodiments. Then, a polishing process is performed, such as a chemical mechanical polishing (CMP) process, to remove extra conductive materials and to form a contact plug structure 126 through the semiconductor layer 106 and the oxide layer 104. In addition, the isolation structure 128 is formed in the position of the first trench 114.

Since the contact plug structure 126 is in direct contact with the substrate 102, the voltage of the substrate 102 may be controlled by the contact plug structure 126 when an electrical voltage is applied to the substrate 102.

Figure 3I:
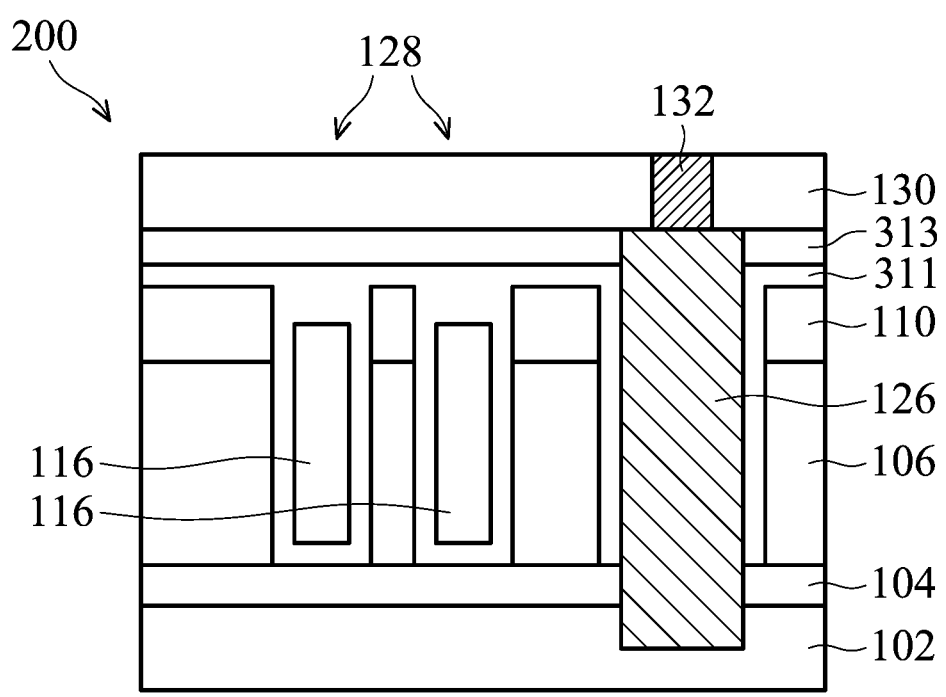

Next, as shown in FIG. 3I, an inter-layer dielectric (ILD) layer 130 is formed on the contact plug structure 126 and the second dielectric layer 313, in accordance with some embodiments. Therefore, a conductive structure 132 is formed in the ILD layer 130, and the conductive structure 132 is electrically connected to the contact plug structure 126. In other words, the conductive structure 132 is electrically connected to the substrate 102 by the contact plug structure 126.

It should be noted that the opening of the second trench 114 is first enclosed during the formation of the second dielectric layer 313, and the photoresist layer 122 is formed after the formation of the second dielectric layer 313. Therefore, the photoresist layer 122 does not flow into the inside of the second trench 114, and the pollution problems resulting from the remaining photoresist materials may be inhibited.

According to the above-mentioned embodiments, a dielectric layer which easily encloses the second trench 114 is deposited, and thus the photoresist material does not flow into the bottom of the second trench 114 to prevent problems resulting from the remaining photoresist material. Furthermore, compared with the second embodiment, a single dielectric material is used to enclose the opening of the second trench 114 in the first embodiment, the thus fabrication cost and time are reduced. In addition, the height of the dielectric layer in the first embodiment is reduced to inhibit the polishing problems caused by the subsequent polishing process.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A semiconductor structure, comprising:
   a substrate;
   a semiconductor layer formed on the substrate;
   an isolation structure through the semiconductor layer, wherein the isolation structure has an opening with a first width, and the isolation structure has a vacuum gap, and a dielectric layer extending from one end to an opposite end of the isolation structure;
   a contact plug structure through the semiconductor layer, wherein the contact plug structure has an opening with a second width, and the second width is greater than the first width; and
   an oxide layer formed between the substrate and the semiconductor layer, wherein the contact plug structure passes through the oxide layer, such that the contact plug structure is in direct contact with the substrate, wherein a sidewall of the contact plug structure in the semiconductor layer and a sidewall of the contact plug structure in the oxide layer are coplanar.

2. The semiconductor structure as claimed in claim 1, further comprising:
   a hard mask layer formed on the semiconductor layer, wherein the isolation structure and the contact plug structure both pass through the hard mask layer.

3. The semiconductor structure as claimed in claim 1, wherein the contact plug structure has a ring structure.

4. The semiconductor structure as claimed in claim 1, wherein the contact plug structure surrounds the isolation structure.

5. The semiconductor structure as claimed in claim 1, wherein a sidewall of the isolation structure comprises the dielectric layer.

6. The semiconductor structure as claimed in claim 1, further comprising:
   an inter-layer dielectric layer formed on the isolation structure and the contact plug structure; and
   a conductive structure through the inter-layer dielectric layer, wherein the conductive structure is electrically connected the contact plug structure.

7. The semiconductor structure as claimed in claim 1, wherein the sidewall of the contact plug structure in the semiconductor layer is in contact with the dielectric layer.

8. The semiconductor structure as claimed in claim 7, wherein the dielectric layer is formed on the semiconductor layer.

9. A method for forming a semiconductor structure as set forth in claim 1, comprising:
   providing a substrate;
   forming an oxide layer on the substrate;
   forming a semiconductor layer on the oxide layer;
   forming a first trench and a second trench in the semiconductor layer, wherein an opening of the first trench has a first width, an opening of the second trench has a second width, and the second width is greater than the first width;
   forming a first dielectric layer on sidewalls of the first trench and the second trench and on the first trench and the second trench, wherein the opening of the first trench is enclosed by the first dielectric layer, but the second trench is not enclosed by the first dielectric layer; and
   removing a portion of the first dielectric layer and a portion of the oxide layer, such that the second trench passes through the oxide layer to expose the substrate.

10. The method for forming the semiconductor structure as claimed in claim 9, further comprising:
    conformally forming a second dielectric layer on sidewalls of the first trench and the second trench, wherein the second trench is not completely filled with the second dielectric layer before forming the first dielectric layer.

11. The method for forming the semiconductor structure as claimed in claim 10, wherein the second dielectric layer is formed below the first dielectric layer.

12. The method for forming the semiconductor structure as claimed in claim 10, further comprising:
    forming a hard mask layer on the semiconductor layer, wherein the second dielectric layer is formed on the hard mask layer.

13. The method for forming the semiconductor structure as claimed in claim 9, further comprising:
    filling a conductive material in the second trench to form a contact plug structure, wherein the contact plug structure is in direct contact with the substrate.

14. The method for forming the semiconductor structure as claimed in claim 13, further comprising:
    forming an inter-layer dielectric layer on the contact plug structure and the second dielectric layer; and
    forming a conductive structure though the inter-layer dielectric layer, wherein the conductive structure is electrically connected to the contact plug structure.

15. The method for forming the semiconductor structure as claimed in claim 9, further comprising:
    forming a hard mask layer on the semiconductor layer, wherein the first dielectric layer is formed on the hard mask layer.

16. The method for forming the semiconductor structure as claimed in claim 9, further comprising:
    filling a conductive material in the second trench to form a contact plug structure.

17. The method for forming the semiconductor structure as claimed in claim 16, further comprising:
    forming an inter-layer dielectric layer on the contact plug structure; and
    forming a conductive structure though the inter-layer dielectric layer, wherein the conductive structure is electrically connected to the contact plug structure.

18. The method for forming the semiconductor structure as claimed in claim 9, further comprising:

forming a photoresist layer on the first dielectric layer, wherein the photoresist layer has an opening, the first dielectric layer on the second trench is exposed by the opening.

19. The method for forming the semiconductor structure as claimed in claim 9, wherein forming the first dielectric layer on sidewalls of the first trench and the second trench and on the first trench and the second trench comprises performing a plasma enhanced chemical vapor deposition (PECVD) process.

* * * * *